(12) United States Patent
Corzine et al.

(10) Patent No.: US 7,352,788 B2
(45) Date of Patent: Apr. 1, 2008

(54) NITRIDE SEMICONDUCTOR VERTICAL CAVITY SURFACE EMITTING LASER

(75) Inventors: Scott W. Corzine, Sunnyvale, CA (US); David P. Bour, Cupertino, CA (US)

(73) Assignee: Avago Technologies ECBU IP (Singapore) Pte, Ltd., Singapore (SG)

( * ) Notice: Subject to any disclaimer, the term of this patent is extended or adjusted under 35 U.S.C. 154(b) by 139 days.

(21) Appl. No.: 11/203,699

(22) Filed: Aug. 15, 2005

(65) Prior Publication Data
US 2007/0036186 A1 Feb. 15, 2007

(51) Int. Cl.
*H01S 5/00* (2006.01)
(52) U.S. Cl. .............................. 372/46.011; 372/46.01
(58) Field of Classification Search ............ 372/50.11, 372/46.01, 46.011, 29.014, 50.124, 83
See application file for complete search history.

(56) References Cited

U.S. PATENT DOCUMENTS

| | | | | |
|---|---|---|---|---|
| 5,073,895 | A | * | 12/1991 | Omura ................ 372/46.011 |
| 5,892,786 | A | * | 4/1999 | Lott ...................... 372/50.124 |
| 6,046,465 | A | | 4/2000 | Wang et al. |
| 6,160,833 | A | * | 12/2000 | Floyd et al. ................ 372/96 |
| 6,233,267 | B1 | | 5/2001 | Nurmikko et al. |
| 6,306,672 | B1 | | 10/2001 | Kim |
| 6,898,215 | B2 | | 5/2005 | Naone et al. |
| 2003/0141604 | A1 | * | 7/2003 | Eisert et al. ................ 257/784 |
| 2005/0170542 | A1 | | 8/2005 | Matsumura |

FOREIGN PATENT DOCUMENTS

| | | |
|---|---|---|
| EP | 1026798 | 8/2000 |
| EP | 1081816 | 3/2001 |
| EP | 1387414 | 2/2004 |

* cited by examiner

*Primary Examiner*—Minsun Oh Harvey
*Assistant Examiner*—Patrick Stafford

(57) ABSTRACT

In one aspect, a VCSEL includes a base region that has a vertical growth part laterally adjacent a first optical reflector and a lateral growth part that includes nitride semiconductor material vertically over at least a portion of the first optical reflector. An active region has at least one nitride semiconductor quantum well vertically over at least a portion of the lateral growth part of the base region and includes a first dopant of a first electrical conductivity type. A contact region includes a nitride semiconductor material laterally adjacent the active region and a second dopant of a second electrical conductivity type opposite the first electrical conductivity type. A second optical reflector is vertically over the active region and forms with the first optical reflector a vertical optical cavity overlapping at least a portion of the at least one quantum well of the active region. A method of fabricating a VCSEL also is described.

15 Claims, 6 Drawing Sheets

US 7,352,788 B2

NITRIDE SEMICONDUCTOR VERTICAL CAVITY SURFACE EMITTING LASER

BACKGROUND

A VCSEL is a laser device formed from an optically active semiconductor region that is sandwiched between a pair of highly reflective mirror stacks, which may be formed from layers of metallic material, dielectric material, or epitaxially-grown semiconductor material. Recently, efforts have been made to extend the operating wavelengths of VCSEL devices to the shorter wavelength range of 200 nm to 600 nm (i.e., the violet to red region of the visible light spectrum). Many nitride semiconductor materials (e.g., GaN based materials, such as GaN, AlGaN, and AlInGaN) have bandgap energies that correspond to this wavelength range. For this reason, significant efforts have been made to fabricate nitride semiconductor light emitting devices that produce light in this wavelength range.

One of the challenges associated with designing high-performance nitride semiconductor VCSELs relates to the high-resistance p-type intra-cavity contacts that typically are formed with nitride semiconductor material. These contacts increase the voltage drop and increase the heat generated within the VCSELs. Another challenge relates to the limited number of quantum wells that can be incorporated in vertical current injection type of VCSEL designs due to non-uniform pumping effects. This limits the optical gain performance that can be achieved.

SUMMARY

In accordance with the invention a transverse current injection approach is used to reduce constraints on the number of quantum wells and the thickness of the p-type contact regions in nitride semiconductor vertical cavity surface emitting lasers (VCSELs). This allows a lower voltage drop, lower heat generation, and a higher optical gain performance than comparable vertical injection type of nitride semiconductor VCSEL designs.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

As used herein, the term "nitride semiconductor material" refers to a nitrogen-containing III-V semiconductor material. Exemplary nitride semiconductor materials include gallium nitride (GaN), indium gallium nitride (InGaN), indium nitride (InN), aluminum gallium nitride (AlGaN), aluminum nitride (AlN), aluminum indium gallium nitride (AlInGaN), gallium arsenide nitride (GaAsN), indium gallium arsenide nitride (InGaAsN), aluminum gallium arsenide nitride (AlGaAsN), gallium phosphide nitride (GaPN), indium gallium phosphide nitride (InGaPN), and aluminum gallium phosphide nitride (AlGaPN). An exemplary sub-set of the nitrogen-containing III-V semiconductor material family is defined by the alloy composition $Al_xIn_yGa_{1-x-y}N$, where $0 \leq x,y \leq 1$ and $0 \leq x+y \leq 1$.

The term "lateral" refers to a direction that is substantially perpendicular to the direction of light emission from a VCSEL. The term "vertical" refers to a direction that is substantially parallel to the direction of light emission from a VCSEL.

Figure 1:
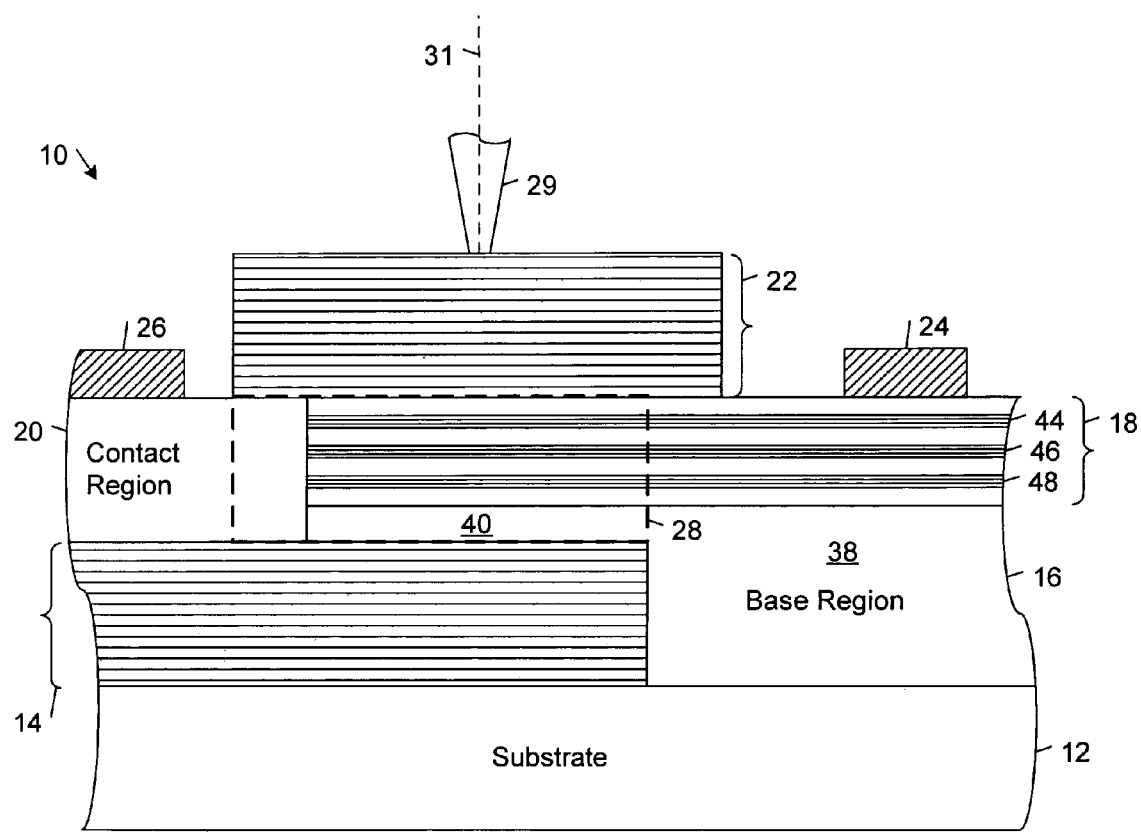
FIG. 1 is a diagrammatic cross-sectional view of an embodiment of a vertical cavity surface emitting laser (VCSEL) in accordance with the invention.

FIG. 1 shows an embodiment in accordance with the invention of a vertical cavity surface emitting laser (VCSEL) 10 that includes a substrate 12, a first optical reflector 14, a base region 16, an active region 18, a contact region 20, and a second optical reflector 22. The VCSEL 10 also includes a first electrode 24 over the active region 18 and a second electrode 26 over the contact region 20. The first and second optical reflectors 14, 22 form a vertical optical cavity 28 that overlaps at least a portion of the active region 18. In operation, light 29 is generated preferentially in the portion of the active region 18 in the optical cavity 28 and is emitted through the second optical reflector 22 along a vertical beam axis 31.

As explained in detail below, the VCSEL 10 employs a transverse current injection approach to reduce constraints on the number of quantum wells and the thickness of the p-type contact regions in nitride semiconductor vertical cavity surface emitting lasers (VCSELs). In this way, embodiments of the VCSEL 10 in accordance with the invention may have a lower voltage drop, lower heat generation, and a higher optical gain performance than comparable vertical injection type of nitride semiconductor VCSEL designs.

Figure 2:
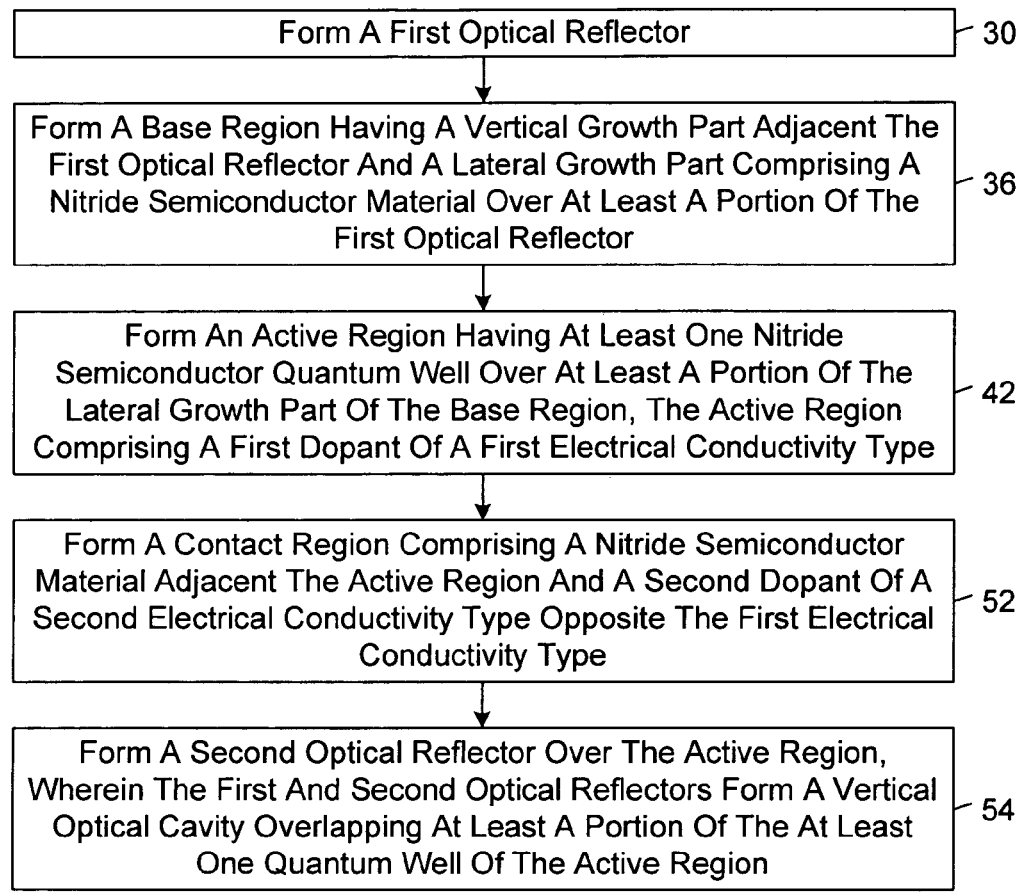
FIG. 2 is a flow diagram of an embodiment in accordance with the invention of a method of fabricating the VCSEL shown in FIG. 1.
Figure 3:
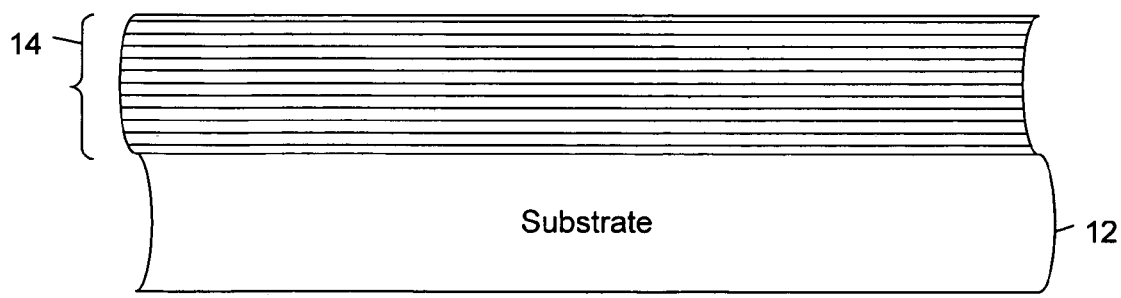
FIGS. 3-10 are diagrammatic cross-sectional views of an embodiment in accordance with the invention of the VCSEL shown in FIG. 1 at different stages of the fabrication method shown in FIG. 2.
Figure 4:
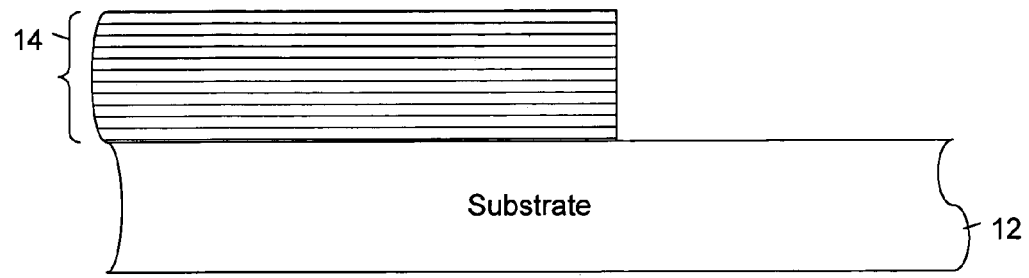

Referring to FIGS. 2-10 and initially to FIGS. 2, 3, and 4, in some embodiments in accordance with the invention, the VCSEL 10 is fabricated as follows.

The first optical reflector 14 is formed on the substrate 16 (block 30; FIG. 2). As shown in FIGS. 3 and 4, in some embodiments in accordance with the invention, the first optical reflector 14 is formed by depositing a stack of alternating layers of different refractive index materials on the substrate 12 (FIG. 3) and patterning the stack of alternating layers (FIG. 4). The stack of alternating layers may be patterned using any one of a wide variety of different photolithographic patterning methods.

In general, the substrate 12 may be any type of supporting structure and may include one or more layers (e.g., semiconducting or insulating layers) on which the first optical reflector 14 and the base region 16 are formed. In some embodiments in accordance with the invention, the substrate 12 is a sapphire substrate. In other embodiments in accordance with the invention, at least the top surface of the substrate 12 is typically formed of one of silicon (Si), gallium arsenide (GaAs), silicon carbide (SiC), gallium nitride (GaN), aluminum nitride (AlN), and indium phosphide (InP).

Typically, the first optical reflector 14 may be any type of structure that is highly reflective of light within the operating wavelength range of the VCSEL 10 (e.g., 200 nm to 600 nm). In the illustrated embodiments in accordance with the invention, the first optical reflector 14 is a distributed Bragg reflector that includes a highly reflective mirror stack, which may be formed from layers of metallic material, dielectric material or epitaxially-grown semiconductor material. In these embodiments, the first optical reflector 14 includes a system of alternating layers of different refractive index materials, where each of the alternating layers has an effective optical thickness (i.e., the layer thickness multiplied by the refractive index of the layer) that is an odd integer multiple of one-quarter of the operating wavelength of the VCSEL 10. Suitable dielectric materials for forming the alternating layers of the first optical reflector 14 include tantalum oxide (TaO), aluminum oxide ($Al_2O_3$), hafnium oxide ($HfO_2$), titanium oxide ($TiO_2$), silicon dioxide ($SiO_2$), titanium nitride (TiN), and silicon nitride (SiN). Suitable semiconducting materials for forming the alternating layers of the first optical reflector 14 include gallium nitride (GaN), aluminum nitride (AlN), and aluminum gallium indium nitride (AlGaInN).

In some embodiments in accordance with the invention, the first optical reflector 14 includes an electrically insulating dielectric top layer that helps to confine the flow of electrical current to the active region 18. The dielectric top layer of the optical reflector 14 may correspond to ones of the layers of alternating reflective pairs of layers or it may correspond to a layer that is incorporated into the optical reflector 14 in addition to the alternating reflective pairs of layers. In some embodiments in accordance with the invention, the first optical reflector 14 includes a top layer that facilitates epitaxial lateral overgrowth of nitride semiconductor material from the base region 16. In some of these embodiments, the top layer of the first optical reflector 14 is formed of silicon dioxide.

Figure 5:
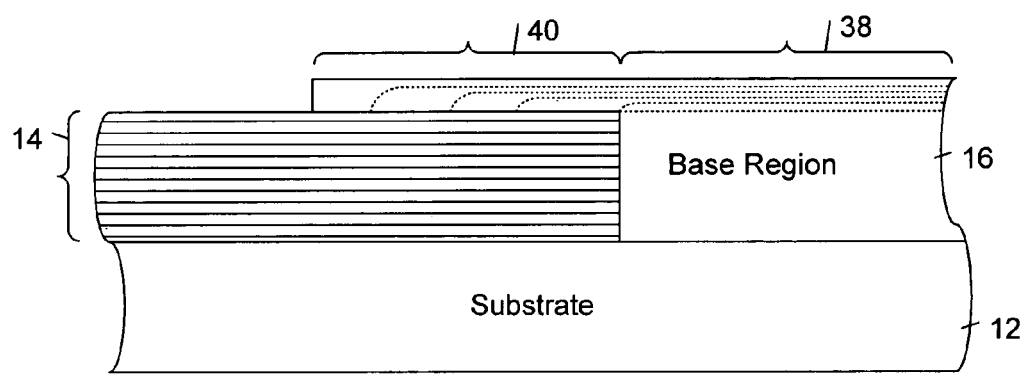

Referring to FIGS. 2 and 5, after the first optical reflector 14 has been formed (block 30; FIG. 2), the base region 16 is formed (block 36; FIG. 2). The base region 16 includes a vertical growth part 38 and a lateral growth part 40. The base region 16 is formed of a nitride semiconductor material that initially grows selectively on the exposed surface of the substrate 12, but not on the top surface of the first optical reflector 14. Due to poor lattice match between the exposed substrate surface and the nitride semiconductor material, the vertical part 38 of the base region 16 typically contains a high density of vertically extended defects. The lateral part 40 of the base region 16 begins to grow when the thickness of the vertical part 38 begins to exceed the thickness of the first optical reflector 14. The growth parameters for the lateral part 40 are selected to achieve a high lateral growth rate relative to the vertical growth rate. The lateral part 40 of the base region 16 is grown anisotropically from one side of the vertical part 38. As a result, the lateral part 40 of the base region 16 is formed of a high-quality epitaxial nitride semiconductor material that is substantially free of lattice mismatch strain-induced dislocations. In some embodiments in accordance with the invention, the top surface of the base region 16 is thinned down by a prescribed amount.

Figure 6:
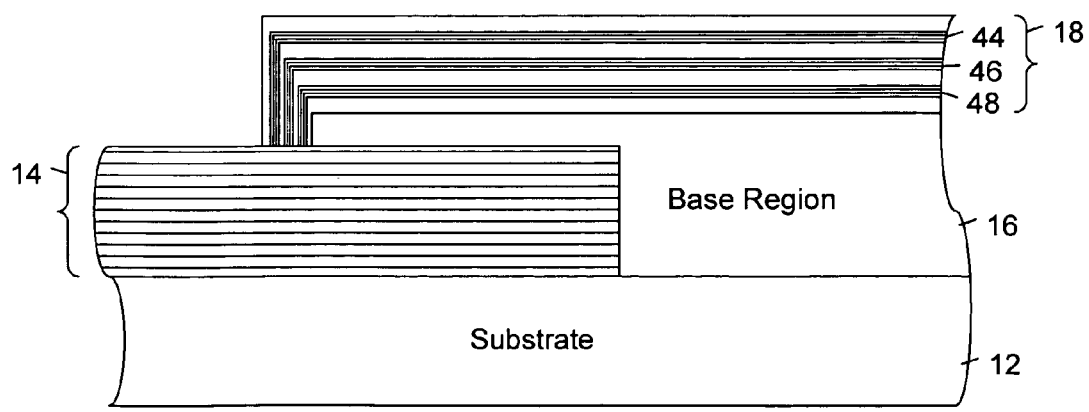
Figure 7:
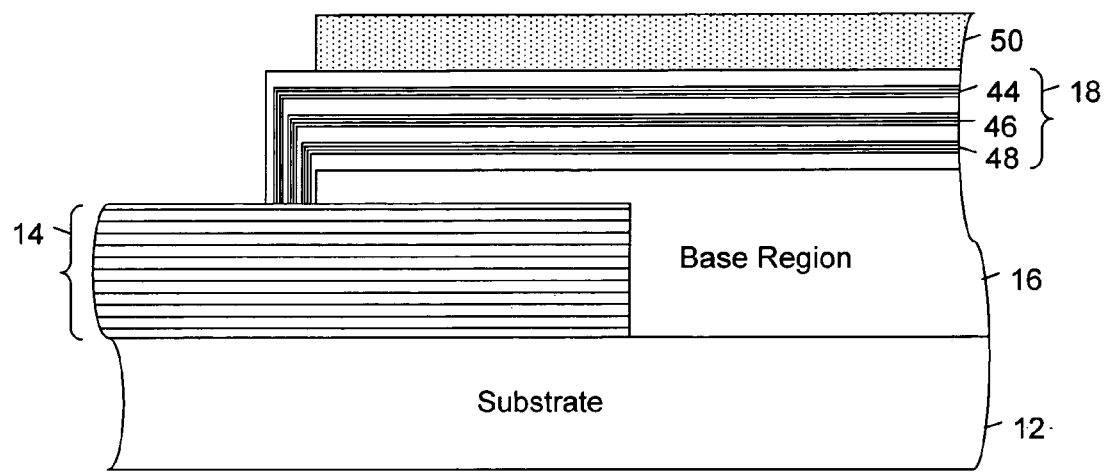

Referring to FIGS. 2, 6, 7, and 8, after the base region 16 has been formed (block 36; FIG. 2), the active region 18 is formed (block 42; FIG. 2). The active region 18 includes one or more nitride semiconductor layers, including one or more quantum well layers or one or more quantum dot layers that are sandwiched between respective pairs of barrier layers. The constituent layers of the active region 18 are deposited over the exposed top and side regions of the base region 16 (FIG. 6). The growth parameters for the active region 18 are selected to achieve a low lateral growth rate relative to the vertical growth rate. The high crystal quality of the lateral part 40 of the base region 16 allows the overlying portions of the active region 18 to grow with a high crystal quality, whereas the lower crystal quality of the vertical part 38 of the base region 16 causes the overlying portions of the active region 18 to grow with a lower crystal quality (e.g., a higher density of dislocation defects).

Figure 8:
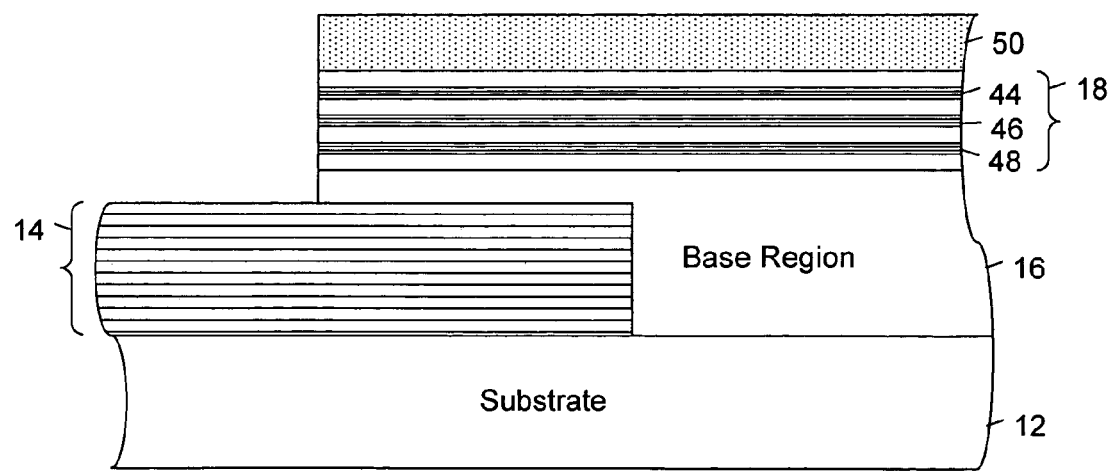

After the active region layers have been deposited on the base region 16, an etch mask layer 50 (e.g., a layer of dielectric material, such as silicon dioxide) is formed on the active region 18 (FIG. 7) and the unmasked sidewall regions of the active region 18 are removed by etching (FIG. 8). Any one of a wide variety of liquid or gas etching methods may used to etch away the side wall regions of the active region 18.

In the embodiment in accordance with the invention shown in FIG. 1, the active region 18 includes three sets of quantum well active regions 44, 46, 48 that are formed of respective quantum well layers located between respective pairs of barrier layers. In general, each of the quantum well layers and the barrier layers is formed of a respective nitride semiconductor material, where the quantum well layers have a bandgap energy that is smaller than the bandgap energies of the adjacent ones of the barrier layers. In some embodiments in accordance with the invention, the quantum wall layers are formed of InGaN and the barrier layers are formed of GaN or InGaN of lower indium alloy content. The locations of the quantum wells 44, 46, 48 substantially coincide with respective electric field peaks in a standing optical wave with the operating light emission wavelength of the VCSEL 10 in the optical cavity 28 that is formed between the first and second reflectors 14, 22. This feature increases the optical gain performance of the active region 18.

One or more of the constituent layers of the active region 18 includes a first dopant of a first electrical conductivity type. In some embodiments in accordance with the invention, the barrier layers of the quantum wells 44, 46, 48 are doped with an n-type dopant (e.g., silicon). In some of these embodiments, the quantum well layers of the quantum wells 44, 46, 48 also are doped with the n-type dopant. In some embodiments in accordance with the invention, the active region 18 includes a top layer that is heavily doped (e.g., in a doping range of $1 \times 10^{17}$ cm$^{-3}$ to $1 \times 10^{20}$ cm$^{-3}$) with the first dopant to facilitate the formation of an ohmic contact with the first electrode 24.

Figure 9:
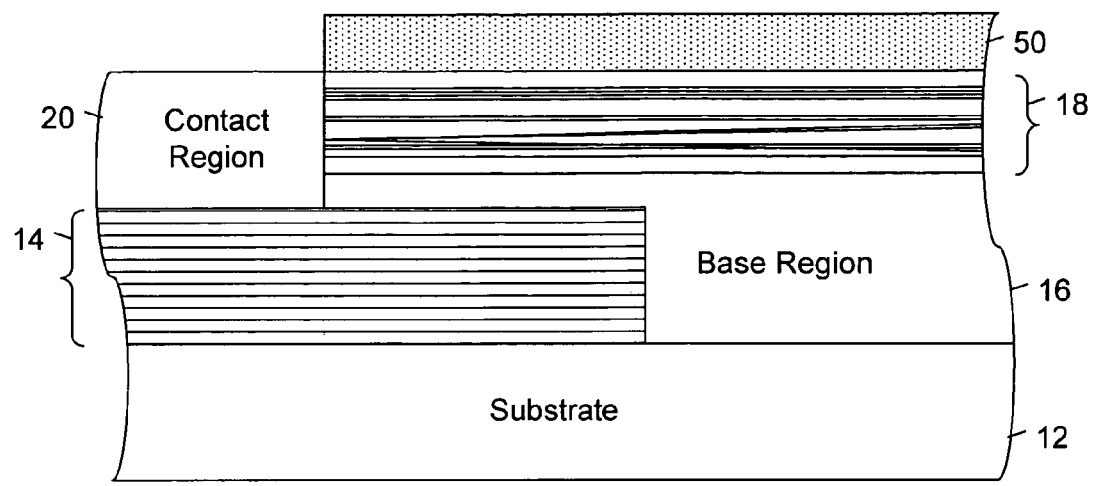

Referring to FIGS. 2 and 9, after the active region 18 has been formed (block 42; FIG. 2), the contact region 20 is formed (block 52; FIG. 2). The contact region 20 is formed by epitaxial lateral overgrowth from the nitride semiconductor material along the exposed sidewall of the active region 18 and the lateral growth part 40 of the base region 16. The growth parameters for the contact region 20 are selected to achieve a high lateral growth rate relative to the vertical growth rate. The contact region 20 includes a second dopant of a second electrical conductivity type opposite the conductivity type of the first dopant in the active region 18. In some embodiments in accordance with the invention, the second dopant is a p-type dopant (e.g., magnesium or zinc). The doping concentration is relatively high (e.g., in a doping range of $1\times10^{17}$ cm$^{-3}$ to $1\times10^{20}$ cm$^{-3}$) to facilitate the formation of an ohmic contact with the second electrode 26.

The lateral geometry of the p-n junction formed by the contact region 20 and the active region 18 allows the contact region 20 to be made with a relatively large thickness, reducing the electrical resistance through the contact region 20. The lateral junction geometry also allows a large number of quantum wells to be incorporated in the active region 18 without leading to the creation of the non-uniform pumping problems that are associated with vertical current injection type of VCSELs. In this way, the lateral junction geometry enables the optical gain performance of the VCSEL 10 to be increased.

Figure 10:
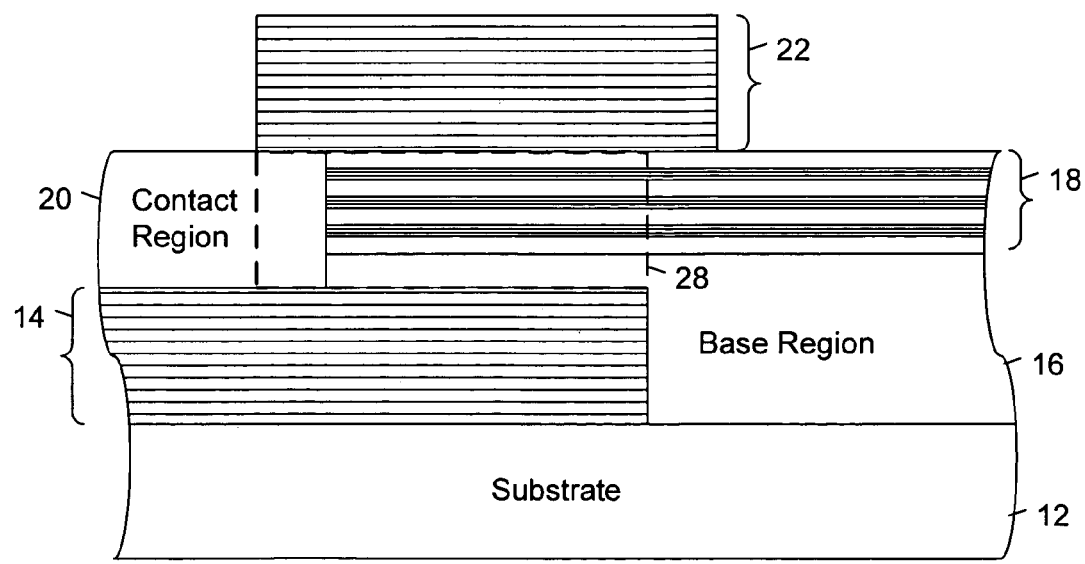

Referring to FIGS. 2 and 10, after the contact region 20 has been formed (block 52; FIG. 2), the second optical reflector 22 is formed (block 54; FIG. 2). In the illustrated embodiment in accordance with the invention, the etch mask layer 50 is removed (e.g., by selective etching) before the second optical reflector 22 is formed. The second optical reflector 22 may be formed directly on the exposed surfaces of the contact region 20 and the active region 18 or on one or more intermediate layers that are deposited over the contact region 20 and the active region 18. The second optical reflector 22 may be formed in the same or similar way as the first optical reflector 14. As explained above, the first and second optical reflectors 14, 22 are constructed and arranged to form the vertical optical cavity 28, which overlaps at least a portion of the active region 18.

Figure 11:
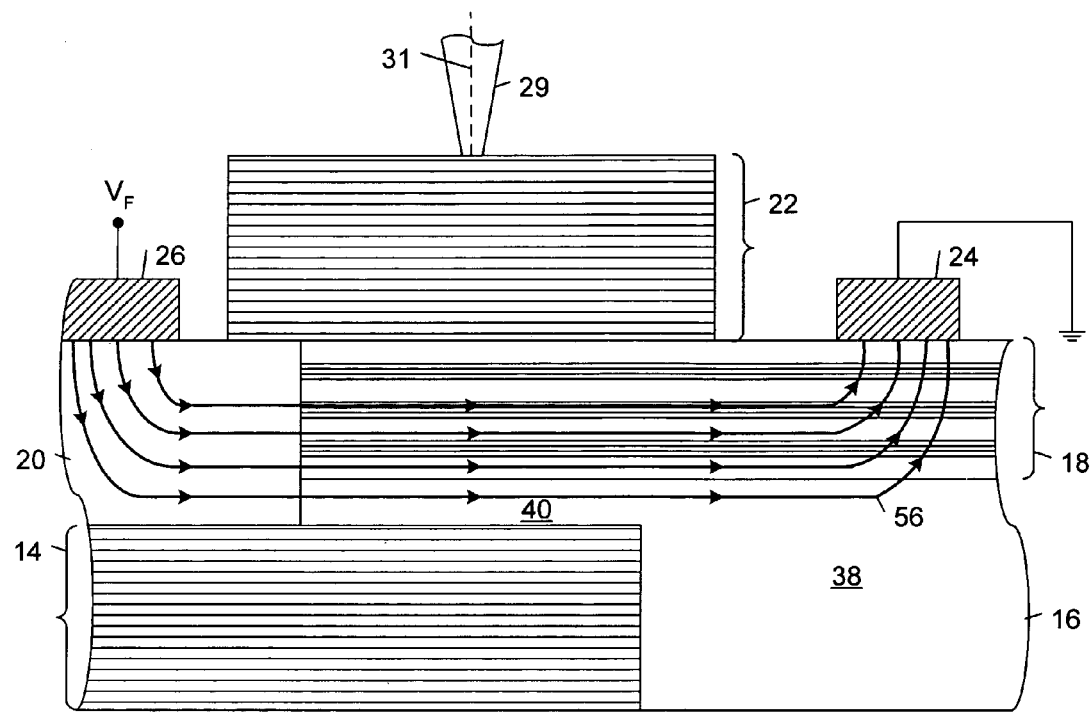
FIG. 11 shows electrical current flow through the VCSEL embodiment of FIG. 1.

Referring to FIGS. 2 and 11, in some embodiments in accordance with the invention, after the second optical reflector has been formed (block 54; FIG. 2), the first and second electrodes 24 and 26 are formed over the heavily doped top layer of the active region 18 and over the heavily doped contact region 20, respectively. The first and second electrodes 24, 26 may be formed of any type of electrically conductive material that forms ohmic contacts with the underlying material layers of the active region 18 and the contact region 20. In some embodiments in accordance with the invention, the first and second electrical contacts 24, 26 are formed by metal evaporation and annealing of a metal alloy selected from Pd—Ni—Au and Ti—Pt—Au.

Referring to FIG. 11, in operation a forward voltage ($V_F$) is applied across the second and first electrodes 26, 24 to laterally inject current from the contact region 20 into the active region 18, as illustrated by the arrowed current flow lines 56. Carrier confinement results from the relatively high electrical resistivity of the first and second optical reflectors 14, 22. These high resistivity regions cause electrical current preferentially to flow laterally through the contact region 20 and the active region 18. In some embodiments in accordance with the invention, high bandgap energy nitride semiconductor material separates the quantum wells 44, 46, 48 in the active region 18. The high bandgap material causes a majority of the electrical current to flow preferentially through the lower bandgap nitride semiconductor material of the quantum well layers; only a relatively small amount of the electrical current flows through the higher bandgap nitride semiconductor material. The VCSEL 10 may additionally include one or more trenches that serve to confine the electrical current and provide optical waveguiding in the lateral dimensions normal to the drawing plane of FIG. 11. The first and second optical reflectors 14, 22 optically confine light within the vertical optical cavity 28. Additional optical confinement also may result from thermal lensing and the refractive index changes induced by the injected carrier distribution. The carrier and optical lateral confinement increases the density of carriers and photons within the portion of the active region 18 that overlaps the vertical optical cavity 28 and, thereby, increases the efficiency with which light 29 is generated within the active region 18 and emitted from the VCSEL 10 along the vertical beam axis 31.

As explained in detail above, the VCSEL 10 employs a transverse current injection approach to reduce constraints on the number of quantum wells and the thickness of the p-type contact regions in nitride semiconductor vertical cavity surface emitting lasers (VCSELs). In this way, embodiments in accordance with the invention may have a lower voltage drop, lower heat generation, and a higher optical gain performance than comparable vertical injection type of nitride semiconductor VCSEL designs.

Other embodiments are within the scope of the claims.

Figure 12:
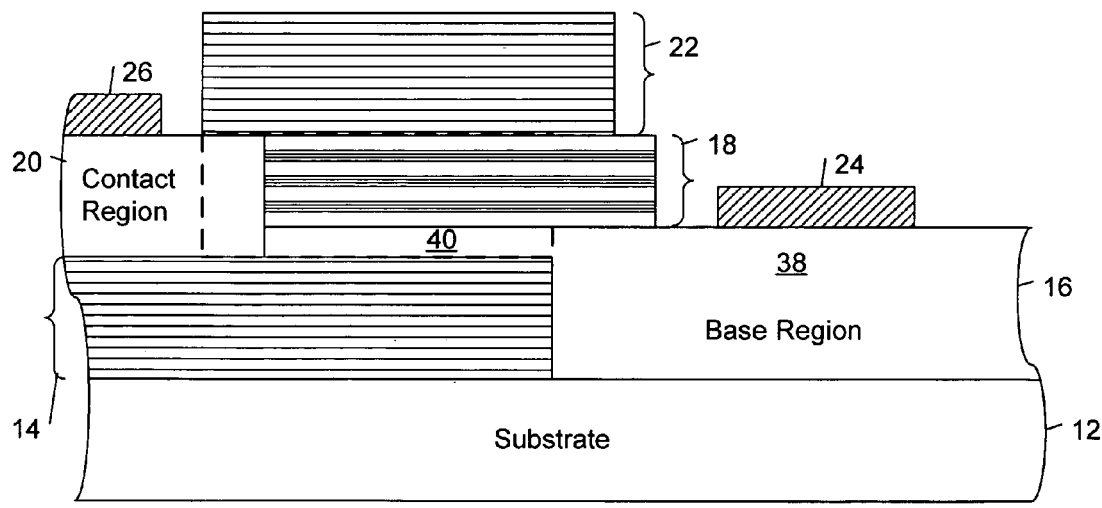
FIG. 12 is a diagrammatic cross-sectional view of an embodiment of a VCSEL in accordance with the invention.

For example, FIG. 12 shows an embodiment in accordance with the invention that includes a first electrode 60 that forms an ohmic contact with the base region 16 instead of the active region 18. In this embodiment, the first electrode 60 is indirectly electrically connected to the active region 18 through the base region 16. In some embodiments in accordance with the invention, a top portion of the base region 16 may be etched down to a heavily doped layer (e.g., a heavily doped n++ layer) in the base region and the first electrode 60 may be formed on the exposed heavily doped layer. In other embodiments in accordance with the invention, the first electrode 60 shown in FIG. 12 may extend to the sidewall of the active region 18. In some of these embodiments, the first electrode 60 may cover the entire sidewall and a portion of the top surface of the active region 18.

Other embodiments in accordance with the invention may include a first electrode on the bottom surface of the substrate 12 rather than on the top surface of the active region as shown in FIG. 1. In these embodiments, the first electrode is indirectly electrically connected to the active region 18 through the substrate 12 and the base region 16.

What is claimed is:

1. A vertical cavity surface emitting laser (VCSEL), comprising:
    a first optical reflector;
    a base region having a vertical growth part laterally adjacent the first optical reflector and a lateral growth part comprising a nitride semiconductor material vertically over at least a portion of the first optical reflector;
    an active region having at least one nitride semiconductor quantum well vertically over at least a portion of the lateral growth part of the base region, the active region comprising a first dopant of a first electrical conductivity type;
    a contact region comprising a nitride semiconductor material laterally adjacent the active region such that current is injected transversely into the active region and a second dopant of a second electrical conductivity type opposite the first electrical conductivity type; and
    a second optical reflector vertically over the active region and forming with the first optical reflector a vertical optical cavity vertically overlapping at least a portion of the at least one quantum well of the active region.

2. The VCSEL of claim 1, wherein the base region is formed of Al$_x$In$_y$Ga$_{1-x-y}$N, where $0 \leq x,y \leq 1$ and $0 \leq x+y \leq 1$.

3. The VCSEL of claim 2, wherein the base region is formed of GaN.

4. The VCSEL of claim 1, wherein the contact region is formed of Al$_x$In$_y$Ga$_{1-x-y}$N, where $0 \leq x,y \leq 1$ and $0 \leq x+y \leq 1$.

5. The VCSEL of claim 4, wherein the contact region is formed of GaN.

6. The VCSEL of claim 1, wherein the first dopant is an n-type dopant and the second dopant is a p-type dopant.

7. The VCSEL of claim 1, wherein the active region comprises a quantum well layer between a pair of barrier layers, each of the quantum well and barrier layers being formed of respective nitride semiconductor material selected from $Al_xIn_yGa_{1-x-y}N$, where $0 \leq x, Y \leq 1$ and $0 \leq x+y1$.

8. The VCSEL of claim 7, wherein the barrier layers are formed of GaN, and the quantum well layer is formed of InGaN.

9. The VCSEL of claim 7, wherein the barrier layers are doped with the first dopant.

10. The VCSEL of claim 9, wherein the quantum well layer is doped with the first dopant.

11. The VCSEL of claim 1, further comprising a first electrode forming an ohmic contact with the contact region.

12. The VCSEL of claim 11, further comprising a second electrode forming an ohmic contact with the active region.

13. The VCSEL of claim 11, further comprising a second electrode electrically connected to the active region through the base region.

14. The VCSEL of claim 1, wherein the at least one quantum well substantially coincides with a peak in a standing optical wave having a specified optical wavelength in the vertical optical cavity.

15. A vertical cavity surface emitting laser (VCSEL), comprising:

a first distributed Bragg reflector;

a GaN base region having a vertical growth part laterally adjacent the first optical reflector and a lateral growth part vertically over at least a portion of the first optical reflector;

an active region vertically over at least a portion of the lateral growth part of the base region and comprising an n-type dopant, wherein the active region comprises a quantum well layer between a pair of barrier layers, each of the quantum well and barrier layers being formed of respective nitride semiconductor material selected from $Al_xIn_yGa_{1-x-y}N$, where $0 \leq x, y \leq 1$ and $0 \leq x+y \leq 1$;

a GaN contact region laterally adjacent the active region such that current is injected transversely into the region and comprising a p-type dopant; and a second distributed Bragg reflector vertically over the active region and defining with the first optical reflector a vertical optical cavity overlapping at least a portion of the at least one quantum well of the active region.

* * * * *

UNITED STATES PATENT AND TRADEMARK OFFICE
CERTIFICATE OF CORRECTION

| | |
|---|---|
| PATENT NO. | : 7,352,788 B2 |
| APPLICATION NO. | : 11/203699 |
| DATED | : April 1, 2008 |
| INVENTOR(S) | : Scott W. Corzine et al. |

It is certified that error appears in the above-identified patent and that said Letters Patent is hereby corrected as shown below:

Column 6, Line 65, Claim 4, delete "$Al_x$," and insert -- $A1_x$ --;

Column 7, Line 7, Claim 7, delete "x,Y" and insert -- x,y --;

Column 7, Line 7, Claim 7, delete "x+y1." and insert -- $x+y \leq 1$. --;

Column 8, line 17, Claim 15, after "into the" insert -- active --.

Signed and Sealed this

First Day of June, 2010

David J. Kappos
*Director of the United States Patent and Trademark Office*